United States Patent
Novellini et al.

(10) Patent No.: US 10,419,203 B1
(45) Date of Patent: Sep. 17, 2019

(54) SELF-MEASUREMENT OF PHASE INTERPOLATOR NON-LINEARITY IN A TRANSCEIVER

(71) Applicant: Xilinx, Inc., San Jose, CA (US)

(72) Inventors: Paolo Novellini, Gorgonzola (IT); Antonello Di Fresco, Abbiategrassso (IT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/444,002

(22) Filed: Feb. 27, 2017

(51) Int. Cl.
*H04L 7/033* (2006.01)

(52) U.S. Cl.
CPC .................................. *H04L 7/0331* (2013.01)

(58) Field of Classification Search
CPC .. G06F 13/42; H04B 1/40; H04B 3/36; H04L 1/205; H04L 7/00; H04L 7/04; H04L 7/002; H04L 7/033; H04L 7/0012; H04L 7/0025; H04L 7/0331; H04L 25/03; H04L 25/20; H04L 25/49
USPC ................. 327/147, 158; 375/226, 296, 357, 375/371–376; 710/105
See application file for complete search history.

(56) References Cited

U.S. PATENT DOCUMENTS

| | | | |
|---|---|---|---|
| 6,397,042 B1* | 5/2002 | Prentice | H04L 1/243 375/355 |
| 7,388,795 B1* | 6/2008 | To | H03L 7/0805 327/158 |
| 7,664,204 B1* | 2/2010 | Wang | H04L 27/0014 375/326 |
| 8,184,029 B1 | 5/2012 | Hsieh et al. | |
| 8,665,928 B1 | 3/2014 | Klein et al. | |
| 8,913,688 B1 | 12/2014 | Jenkins | |
| 8,934,594 B1 | 1/2015 | Malhotra | |
| 9,065,601 B1* | 6/2015 | Jenkins | H04L 7/0337 |
| 9,118,447 B1 | 8/2015 | Malhotra | |
| 9,148,192 B1 | 9/2015 | Wong et al. | |
| 9,208,130 B1 | 12/2015 | Chen | |
| 9,209,960 B1 | 12/2015 | Leung et al. | |
| 9,264,211 B1 | 2/2016 | Jenkins | |
| 9,313,017 B1 | 4/2016 | Liao et al. | |
| 9,331,724 B2 | 5/2016 | Novellini et al. | |
| 9,356,775 B1 | 5/2016 | Xu et al. | |
| 9,413,524 B1 | 8/2016 | Xu et al. | |
| 2007/0038789 A1* | 2/2007 | Macri | H03L 7/07 710/105 |
| 2013/0294490 A1* | 11/2013 | Chandrasekaran | H04L 7/0079 375/226 |

* cited by examiner

*Primary Examiner* — Shawkat M Ali
(74) *Attorney, Agent, or Firm* — Patterson + Sheridan, LLP

(57) ABSTRACT

An example circuit includes: a transmitter configured to transmit a clock pattern based on a transmit clock; a receiver, coupled to the transmitter, configured to sample the clock pattern based on a receive clock to generate a bit pattern, where there is a non-zero frequency difference between the transmit clock and the receive clock; a phase interpolator (PI) configured to add a phase shift to a source clock to supply one of the transmit clock or the receive clock; and a test circuit configured to apply adjustments to the phase shift over a time period and determine a phase distribution of the PI based on changes in the bit pattern over the time period.

20 Claims, 6 Drawing Sheets

SELF-MEASUREMENT OF PHASE INTERPOLATOR NON-LINEARITY IN A TRANSCEIVER

TECHNICAL FIELD

Examples of the present disclosure generally relate to electronic circuits and, in particular, to self-measurement of phase interpolator (PI) non-linearity in a transceiver.

BACKGROUND

In a transceiver, such as a serializer/deserializer (SERDES), a clock delivery system can include a phase-locked loop (PLL) that generates one or more dock signals for use in transmitting and receiving data. A phase interpolator (PI) can be used to interpolate a clock signal by shifting its phase by a discrete amount over a given range. For example, a PI can shift the phase in steps that are a fraction of a unit interval (UI), such as 1/64 UI. In a transmitter, a PI is used to adjust the phase the phase of the transmitted data. In a receiver, a PI is used to adjust the phase of the sampling clock used to sample the received data.

Various applications that use a SERDES may assume that the spacing between phase steps of a PI ("phase distribution") is uniform. Thus, non-linear phase distribution of a PI will affect the precision of the application being supported. Non-linear phase distribution is caused by silicon impairments and thus each SERDES can have different non-linear phase distributions for different instances of PIs therein. Many applications would benefit from knowing the specific phase distribution(s) of the specific SERDES being used. While the phase distribution of a PI can be determined using an external high-speed scope, such testing is limited to a laboratory environment and becomes impracticable at production level.

SUMMARY

Techniques for self-measurement of phase interpolator (PI) non-linearity in a transceiver. In an example, a circuit includes: a transmitter configured to transmit a clock pattern based on a transmit clock; a receiver, coupled to the transmitter, configured to sample the clock pattern based on a receive clock to generate a bit pattern, where there is a non-zero frequency difference between the transmit clock and the receive clock; a phase interpolator (PI) configured to add a phase shift to a source clock to supply one of the transmit clock or the receive clock; and a test circuit configured to apply adjustments to the phase shift over a time period and determine a phase distribution of the PI based on changes in the bit pattern over the time period.

In another example, an integrated circuit (IC) includes: a transceiver including: a transmitter configured to transmit a clock pattern based on a transmit clock; receiver, coupled to the transmitter, configured to sample the clock pattern based on a receive clock to generate a bit pattern, where there is a non-zero frequency difference between the transmit clock and the receive clock; and a phase interpolator (PI) configured to add a phase shift to a source clock to supply one of the transmit clock or the receive clock; and a test circuit configured to apply adjustments to the phase shift over a time period and determine a phase distribution of the PI based on changes in the bit pattern over the time period.

In another example, a method of determining a phase distribution of a phase interpolator (PI) includes: transmitting a clock pattern based on a transmit clock; sampling the clock pattern based on a receive clock to generate a bit pattern where there is a non-zero frequency difference between the transmit clock and the receive clock; supplying one of the transmit clock or the receive clock by adding a phase shift to a source clock using the PI; applying adjustments to the phase shift over a time period; and determining the phase distribution of the PI based on changes in the bit pattern over the time period.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
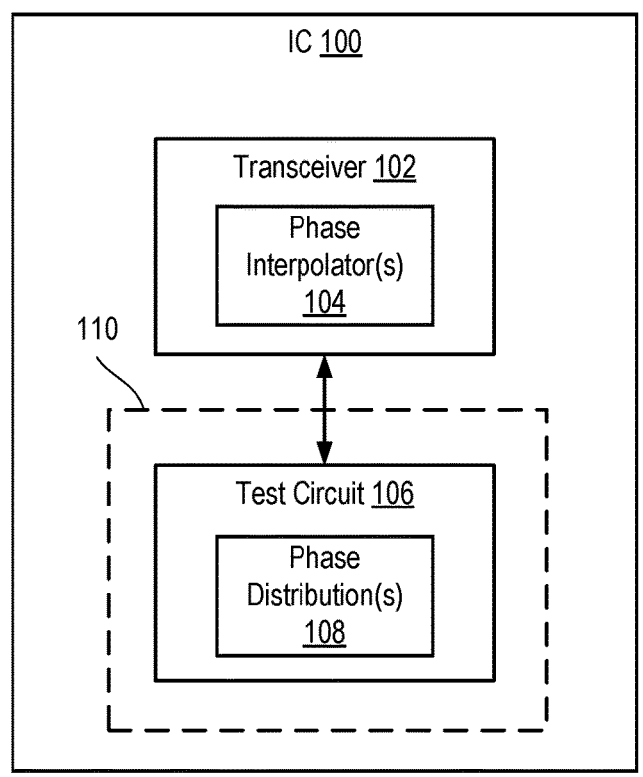
FIG. 1 is a block diagram depicting an integrated circuit (IC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for self-measurement of phase interpolator (PI) non-linearity in a transceiver are described. The techniques can be used to measure PI non-linearity on a per-transceiver basis, without the use of external measurement tools. The techniques are valid to measure PI non-linearity in both a receiver and a transmitter within a transceiver. In an example, the transmitter is configured to transmit a clock pattern based on a transmit clock. A receiver is coupled to the transmitter and is configured to sample the clock pattern based on a receive clock to generate a bit pattern. There is a non-zero frequency difference between the transmit clock and the receive clock. A PI in either the transmitter or the receiver is configured to add a phase shift to a source clock to supply either the transmit clock or the receive clock, respectively. A test circuit is configured to apply adjustments to the phase shift over a time period and determine a phase distribution of the PI based on changes in the bit pattern over time. This technique can be implemented on any transceiver having loopback capability. These and further aspects are described below with respect to the drawings.

FIG. 1 is a block diagram depicting an integrated circuit (IC) 100 according to an example. The IC 100 includes a transceiver 102 and a test circuit 106. In an example, the IC 100 is a programmable IC, such as a field programmable gate array (FPGA), complex programmable logic device (CPLD), or the like. In such an example, the IC 100 can include a programmable fabric 110. In general, the programmable fabric 110 includes configurable logic elements and programmable interconnect that can be programmed ("configured") to implement various circuits. An example programmable fabric of an FPGA is described in further detail below. In an example, the test circuit 106 is configured in the programmable fabric 110, while the transceiver 102 is hardened circuitry. Alternatively, the test circuit 106 also can be hardened circuitry within IC 100. In other examples, the IC 100 can be an application specific integrated circuit (ASIC) or the like, where both the transceiver 102 and the test circuit 106 are hardened circuitry.

In general, the transceiver 102 includes both transmitter circuitry for transmitting a signal and receiver circuitry for receiving a signal. For example, the transceiver 102 can be a serializer/deserializer (SERDES). An example of the transceiver 102 is described further below. The transmitter/receiver circuitry can include one or more phase interpolators 104 for supplying clocks used to transmit and receive signals. A phase interpolator is a circuit that adjusts the phase of a source clock in increments over a particular range (e.g., increments of 1/64 of a unit interval (UI)). Ideally, the increments are uniformly distributed over the range. However, in practice, silicon impairments and other process variations can cause a phase interpolator to have a non-linear phase distribution (e.g., the spacing between successive phase increments can vary from one pair of increments to the next).

The test circuit 106 is configured to control the transceiver 102 in a test mode to determine phase distribution(s) 108 of the phase interpolator(s) 104. The test circuit 106 can determine the phase distribution(s) 108 without the use of external measurement tools. A user can interact with test circuit 106 to test the transceiver 102 and obtain the phase distribution(s) 108. In this manner, the test circuit 106 can be used to measure phase interpolator non-linearity on a per-transceiver basis in the IC 100. While the IC 100 in the example includes a single transceiver 102, in other examples, the IC can include a plurality of transceivers 102. The test circuit 106 can test each of a plurality of transceivers 102 or the IC 100 can include multiple instances of the test circuit 106 for testing a plurality of the transceivers 102.

Figure 2:
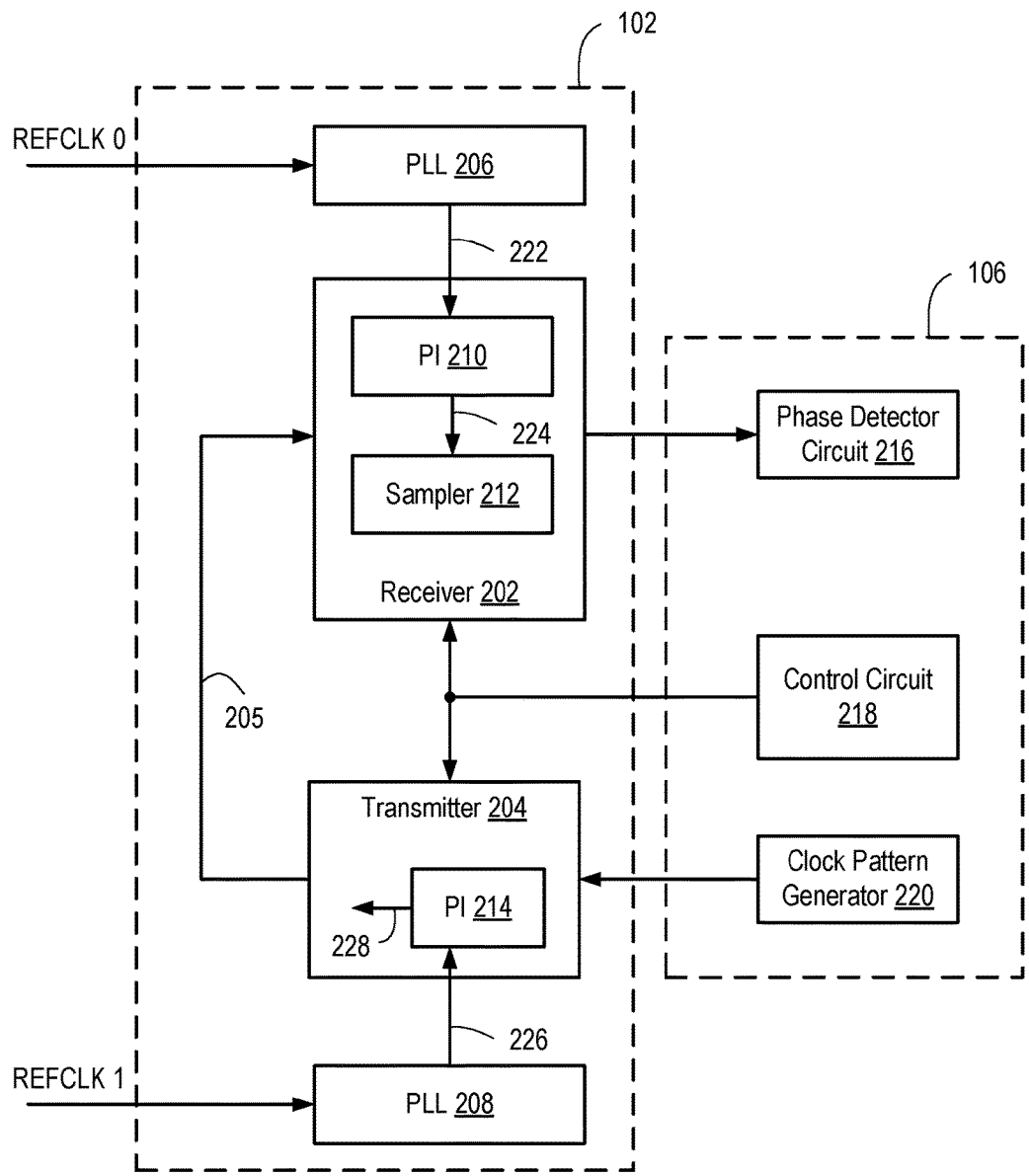
FIG. 2 is a block diagram depicting a transceiver and a test circuit according to an example.

FIG. 2 is a block diagram depicting the transceiver 102 and the test circuit 106 according to an example. The transceiver 102 includes a receiver 202 and a transmitter 204. The receiver 202 includes a phase interpolator (PI) 210 and a sampler 212. The transmitter 204 includes a PI 214. The transceiver 102 further includes a phase-locked loop (PLL) 206 and a PLL 208. An output of the transmitter 204 is coupled to an input of the receiver 202. For example, the transmitter 204 can be coupled to the receiver 202 through a loopback connection 205 (e.g., a serial loopback connection). The test circuit 106 includes a phase detector circuit 216, a control circuit 218, and a clock pattern generator 220.

In operation, the PLL 206 receives a reference clock (REFCLK 0) and generates a receive source clock 222 based on REFCLK 0. The PI 210 generates a receive clock 224 from the receive source clock 222. In particular, the PI 210 adds a phase shift to the receive source clock 222 to generate the receive clock 224. The control circuit 218 can set the value of the phase shift of the PI 210. The sampler 212 samples the output of the transmitter 204 using the receive clock 224. The receiver 202 can include various other components that are omitted for clarity, such as an analog front end (AFE), an equalizer, clock and data recovery (CDR) circuitry, deserializer circuitry, decoder circuitry, and the like. An output of the receiver is coupled to an input of the phase detector circuit 216.

The PLL 208 receives a reference clock (REFCLK 1) and generates a transmit source clock 226 based on REFCLK 1. The PI 214 generates a transmit clock 228 from the transmit source clock 226. In particular, the PI 214 adds a phase shift to the transmit source clock 226 to generate the transmit clock 228. The control circuit 218 can set the value of the phase shift of the PI 214. The transmitter 204 outputs a signal based on the transmit clock 228. The transmitter 204 can include various other components that are omitted for clarity, such as drivers, pre-emphasis circuits, serializer circuitry, encoder circuitry, and the like.

Figure 3:
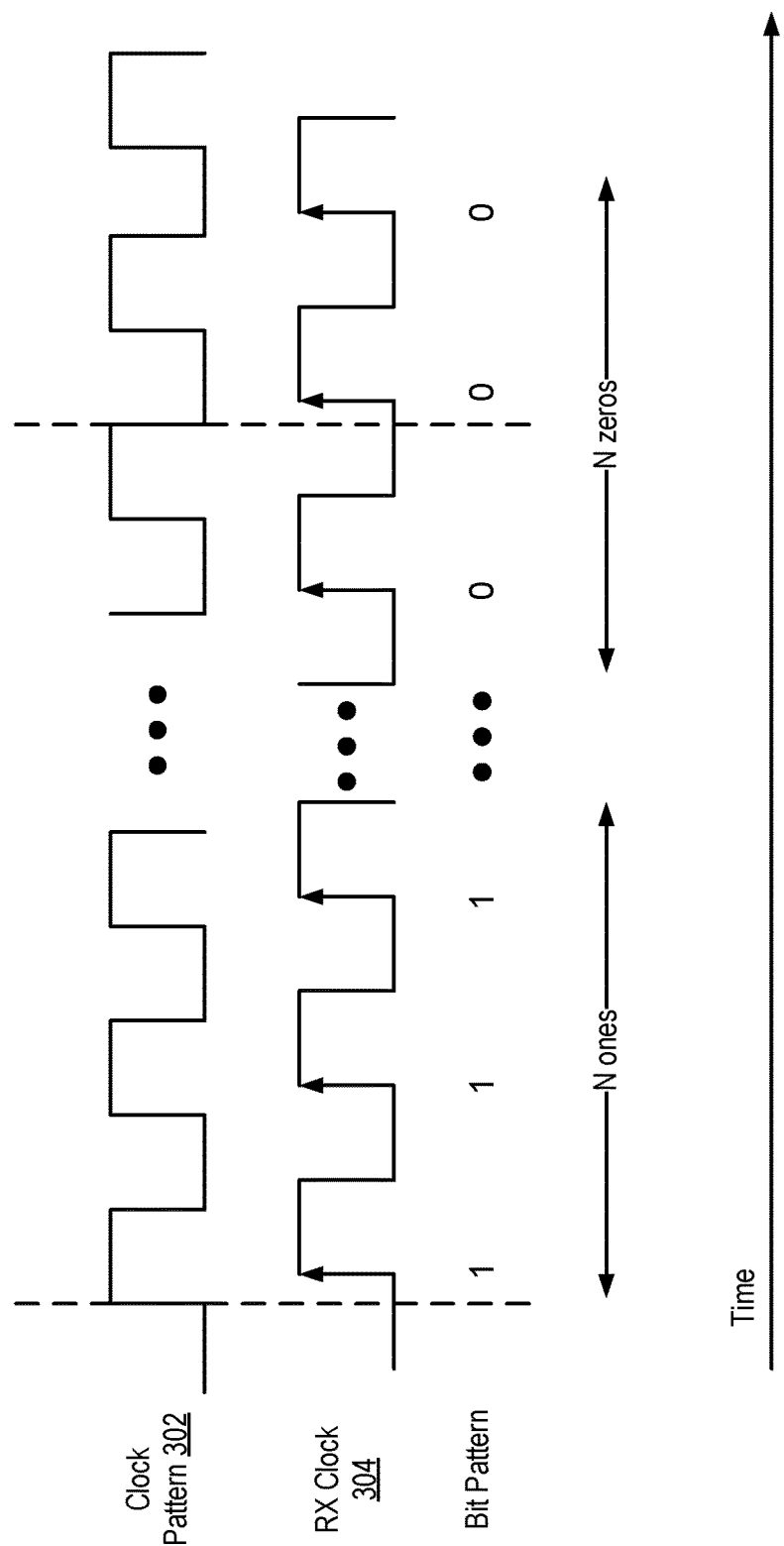
FIG. 3 is a diagram illustrating signals in a transceiver according to an example.

To test the transceiver 102, the reference clocks REFCLK 0 and REFCLK 1 are locked and set to have a known, non-zero frequency difference. The clock pattern generator 220 provides input data to the transmitter 204 so that the transmitter 204 generates a clock pattern for transmission (i.e., a sequence of alternating logic zero and logic one values). The frequency of the clock pattern is equal to the frequency of the transmit clock 228. FIG. 3 is a signal diagram that includes an example clock pattern 302 generated by the transmitter 204.

At the receiver 202, the sampler 212 samples the signal transmitted by the transmitter 204 based on the receive clock 224 supplied by the PI 210. The output of the sampler is a bit pattern that periodically repeats over time. FIG. 3 shows an example receive clock 304 used to sample the output of the transmitter. Since the reference clocks have different frequencies, the receive clock 304 has a different frequency than the clock pattern and thus "slides" with respect to the clock pattern over time.

For example, if the parts per million (ppm) difference between the reference clocks REFCLK 0 and REFCLK 1 is 100 ppm, one clock will need 10,000 UIs to slide one UI of the other clock. Similarly, if the ppm difference is 1 ppm, one clock will need 1 million UIs to slide one UI of the other clock. The bit pattern output by the sampler 212 includes N ones followed by N zeros periodically repeated over time. For example, given a 100 ppm difference between REFCLK 0 and REFCLK 1, the bit pattern includes 5000 ones followed by 5000 zeros periodically repeated over time (with a period of 10,000 samples).

If the phase difference added by the PI 214 is stepped by one phase increment, the bit pattern generated by the sampler 212 will shift accordingly. For example, the PI 214 can have a resolution of 1/64 UI. In such case, the bit pattern (assuming a 10,000 sample period) will be shifted by: 10,000/64, which is approximately equal to 156 bits. The phase detector circuit 216 is configured to detect changes in the bit pattern generated by the sampler 212. For example, the phase detector circuit 216 can detect a transition between logic 0 and logic 1 and begin counting the number of ones for each period of 10,000 samples (assuming 100 ppm difference in reference clocks). Alternatively, the phase detector circuit 216 can count the number of zeros. The phase detector circuit 216 can have other implementations. For each phase increment of the PI 214, the phase detector circuit 216 can compare the expected shift in the bit pattern with the actual shift in the bit pattern. In the example above, non-linearity in the PI 214 will cause a shift in the bit pattern that differs from the expected 156 bits for each phase increment. Assuming the transmitter is operating at 12.5 Gbits/s (i.e., UI=80 ps), each phase increment for the PI 214 (equal to 1.25 ps) should produce the shift of 156 bits in the bit pattern with a resolution of 1.25 ps/156, which is approximately equal to 8 fs. Thus, any non-linearity in the phase increment of the PI 214 can be detected with a resolution of 8 fs in the example. Those skilled in the art will appreciate that the values above are exemplary and that the ppm difference between the reference clocks, the resolution of the PI 214, and the transmission rate of the transmitter 204 can have difference values, resulting in different values of the sample period, the expected shift of the bit pattern for each phase increment, and the resolution.

In an example, the control circuit 218 varies the phase shift added by the PI 214 over time and the phase detector circuit 216 tracks the shifts in the bit pattern over time. The phase detector circuit 216 compares the shifts in the bit pattern with the expected shift for each phase increment and generates a phase distribution for the PI 214 based on the differences between the actual shifts and the expected shift. The same technique can be employed to determine a phase distribution for the PI 210. In such case, the control circuit varies the phase shift added by the PI 210, rather than the PI 214. Otherwise, the test circuit 106 operates as described above.

Figure 4:
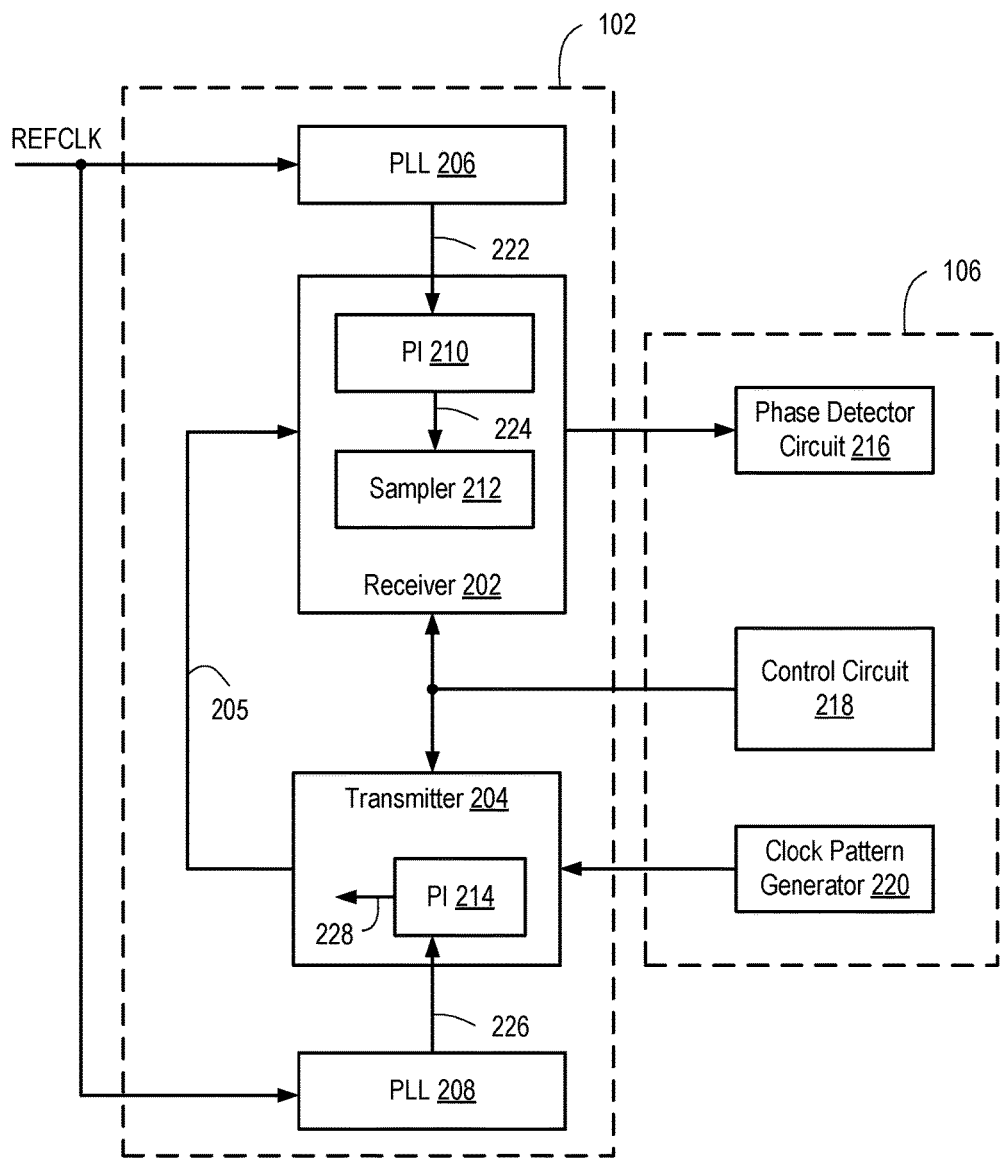
FIG. 4 is a block diagram depicting a transceiver and a test circuit according to an example.

FIG. 4 is a block diagram depicting the transceiver 102 and the test circuit 106 according to another example. Elements of FIG. 4 that are the same or similar to those of FIG. 2 are designated with identical reference numerals and described in detail above. In the present example, a single reference clock is used instead of two reference clocks. Each of the PLLs 206, 208 comprises a fractional-PLL capable of imparting a non-zero PPM difference between the transmit source clock 226 and the receive source clock 222. This obviates the need for two difference reference clocks. Otherwise, the transceiver 102 and the test circuit 106 operate as described above.

Figure 5:
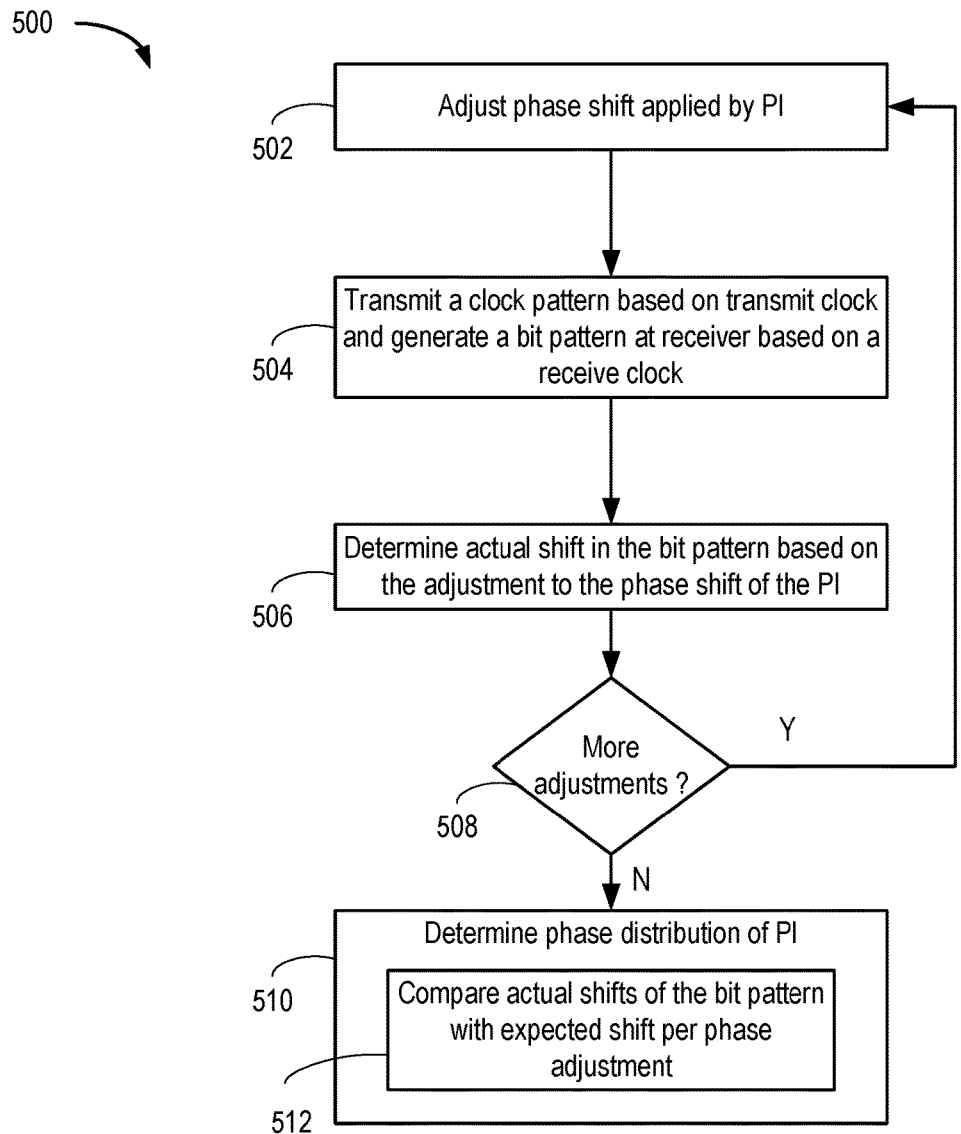
FIG. 5 is a flow diagram a method of determining a phase distribution of a phase interpolator (PI) according to an example.

FIG. 5 is a flow diagram depicting a method 500 of determining a phase distribution of a phase interpolator (PI) according to an example. The method 500 begins at step 502, where the test circuit 106 adjusts a phase shift of the PI. For example, the control circuit 218 can increment the phase shift of the PI 214 or the PI 210 one phase increment (e.g., 1/64 UI). At step 504, the transmitter 204 transmits a clock pattern and the receiver 202 samples the clock pattern to generate a bit pattern. At step 506, the phase detector circuit 216 determines an actual shift in the bit pattern based on the adjustment to the phase shift of the PI.

At step 508, the control circuit 218 determines if another phase adjustment is to be performed. For example, the control circuit 218 can perform a plurality of phase adjustments over the range of the PI 214 (e.g., 64 phase adjustments for a PI having a resolution of 1/64 UI). If another phase adjustment is to be performed, the method 500 returns to step 502 and repeats. Otherwise, the method 500 proceeds to step 510.

At step 510, the phase detector circuit 216 determines a phase distribution for the PI. For example, at step 512, the phase detector circuit 216 can compare the actual shifts in the bit pattern with an expected shift. The differences between actual and expected shifts in the bit pattern for each phase adjustment provide the phase distribution that accounts for non-linearity of the PI. The method 500 can be used to test both the PI 214 and the PI 210.

Figure 6:
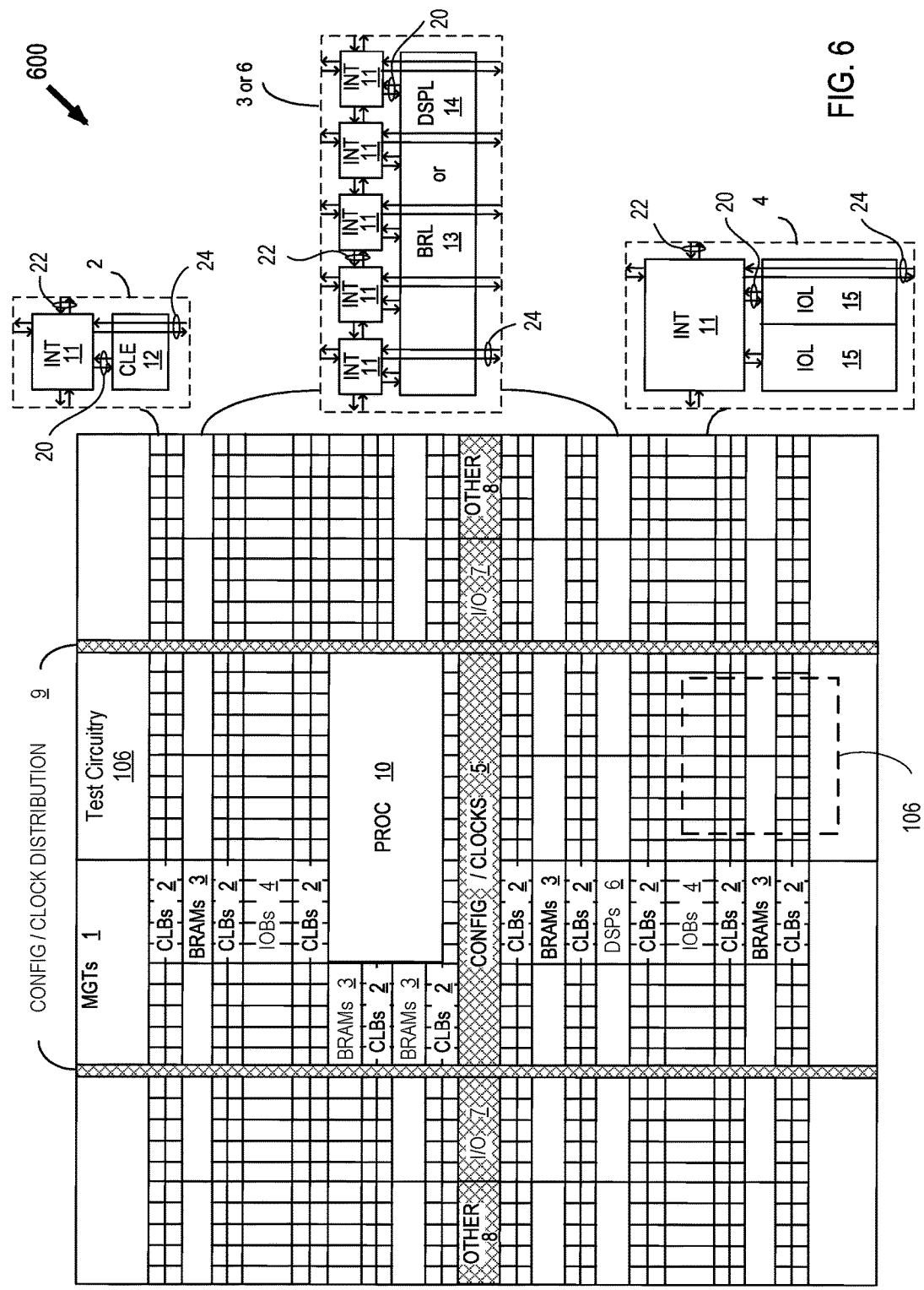
FIG. 6 illustrates an example field programmable gate array (FPGA) in which techniques described herein can be used.

The test circuit 106 described above can be implemented within an integrated circuit, such as a field programmable gate array (FPGA) or like type programmable circuit. FIG. 6 illustrates an architecture of FPGA 600 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 600 can include one or more instances of SerDes 122 described above.

In some FPGAs, each programmable tile can include at least one programmable interconnect element ("INT") 11 having connections to input and output terminals 20 of a programmable logic element within the same tile, as shown by examples included at the top of FIG. 6. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 6) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

As shown in FIG. 6, the FPGA 600 can include a hardened implementation of the test circuit 106. Alternatively, the test circuit 106 can be configured in the programmable fabric of the FPGA 600 (shown by a dashed box). The test circuit 106 can be used to determine phase distribution of PIs, such as PIs in the MGTs 1.

While the foregoing is directed to specific examples, other and further examples may be devised without departing from the basic scope thereof, and the scope thereof is determined by the claims that follow.

What is claimed is:

1. A circuit, comprising:
    a transmitter configured to transmit a clock pattern based on a transmit clock, the transmitter including a first phase interpolator (PI) configured to supply the transmit clock;
    a receiver, coupled to the transmitter, configured to sample the clock pattern based on a receive clock to generate a bit pattern, where there is a non-zero frequency difference between the transmit clock and the receive clock, the receiver including a second PI configured to supply the receive clock; and
    a test circuit configured to apply a plurality of adjustments to a phase shift implemented by selected one of the first PI and the second PI over a time period, determine comparisons of each shift in a source clock supplied by the selected PI with an expected shift for each of the plurality of adjustments to the phase shift of the selected PI, and determine, from the comparisons, a phase distribution of the selected PI based on changes in the bit pattern over the time period.

2. The circuit of claim 1, wherein the selected PI is configured to supply the transmit clock, and wherein the source clock is a transmit source clock.

3. The circuit of claim 2, further comprising:
    a first phase-locked loop (PLL) configured to generate the transmit source clock from a first reference clock; and
    a second PLL configured to generate a receive source clock from a second reference clock;
    wherein the receive clock is, or is derived from, the receive source clock.

4. The circuit of claim 2, further comprising:
    a first phase-locked loop (PLL) configured to generate the transmit source clock from a reference clock; and
    a second PLL configured to generate a receive source clock from the reference clock; and
    wherein the receive clock is, or is derived from, the receive source clock.

5. The circuit of claim 1, wherein the selected PI is configured to supply the receive clock, and wherein the source clock is a receive source clock.

6. The circuit of claim 5, further comprising:
    a first phase-locked loop (PLL) configured to generate a transmit source clock from a first reference clock; and
    a second PLL configured to generate the receive source clock from a second reference clock;
    wherein the transmit clock is, or is derived from, the transmit source clock.

7. The circuit of claim 5, further comprising:
    a first phase-locked loop (PLL) configured to generate a transmit source clock from a reference clock; and
    a second PLL configured to generate the receive source clock from the reference clock; and
    wherein the transmit clock is, or is derived from, the transmit source clock.

8. An integrated circuit (IC), comprising:
    a transceiver including: a transmitter configured to transmit a clock pattern based on a transmit clock, the transmitter including a first phase interpolator (PI) configured to supply the transmit clock; receiver, coupled to the transmitter, configured to sample the clock pattern based on a receive clock to generate a bit pattern, where there is a non-zero frequency difference between the transmit clock and the receive clock, the receiver including a second PI configured to supply the receive clock; and
    a test circuit configured to apply a plurality of adjustments to a phase shift implemented by selected one of the first PI and the second PI over a time period, determine comparisons of each shift in a source clock supplied by the selected PI with an expected shift for each of the plurality of adjustments to the phase shift of the selected PI, and determine, from the comparisons, a phase distribution of the selected PI based on changes in the bit pattern over the time period.

9. The IC of claim 8, wherein the selected PI is configured to supply the transmit clock, and wherein the source clock is a transmit source clock.

10. The IC of claim 8, wherein the selected PI is configured to supply the receive clock, and wherein the source clock is a receive source clock.

11. The IC of claim 8, further comprising:
    a programmable fabric comprising configurable logic elements and programmable interconnect;
    wherein the test circuit is configured in the programmable fabric.

12. The IC of claim 9, wherein the test circuit comprises a clock pattern generator that supplies data to the transmitter to generate the clock pattern.

13. The IC of claim 8, wherein the receiver is coupled to the transmitter by a loopback connection.

14. A method of determining a phase distribution of a phase interpolator (PI), comprising:
    transmitting a clock pattern based on a transmit clock, the transmit clock supplied by a first phase interpolator (PI);
    sampling the clock pattern based on a receive clock to generate a bit pattern where there is a non-zero frequency difference between the transmit clock and the receive clock, the receive clock supplied by a second PI;

adding a phase shift to a source clock using selected one of the first PI and the second PI;

applying a plurality of adjustments to the phase shift implemented by the selected PI over a time period;

determining comparisons of each shift in the source clock supplied by the selected PI with an expected shift for each of the plurality of adjustments to the phase shift of the selected PI; and determining, from the comparisons, the phase distribution of the selected PI based on changes in the bit pattern over the time period.

15. The method of claim 14, wherein the selected PI is configured to supply the transmit clock, and wherein the source clock is a transmit source clock.

16. The method of claim 15, further comprising:
generating the transmit source clock from a first reference clock; and
generating a receive source clock from a second reference clock;
wherein the receive clock is, or is derived from, the receive source clock.

17. The method of claim 15, further comprising:
generating the transmit source clock and a receive source clock from a reference clock;
wherein the receive clock is, or is derived from, the receive source clock.

18. The method of claim 14, wherein the selected PI is configured to supply the receive clock, and wherein the source clock is a receive source clock.

19. The method of claim 18, further comprising:
generating a transmit source clock from a first reference clock; and
generating the receive source clock from a second reference clock;
wherein the transmit clock is, or is derived from, the transmit source clock.

20. The method of claim 18, further comprising:
generating a transmit source clock and the receive source clock from a reference clock;
wherein the transmit clock is, or is derived from, the transmit source clock.

* * * * *